(12) United States Patent
Ming et al.

(10) Patent No.: US 12,681,060 B2
(45) Date of Patent: Jul. 14, 2026

(54) METHOD FOR DETECTING A TOPOLOGICAL STRUCTURE OF A GROUNDING GRID UNDER EXTREMELY COLD CONDITION

(71) Applicant: CHONGQING UNIVERSITY, Chongqing (CN)

(72) Inventors: Ruotong Ming, Chongqing (CN); Fan Yang, Chongqing (CN); Zhili Li, Chongqing (CN); Tian Tan, Chongqing (CN); Jihua Ge, Chongqing (CN); Hui Jiang, Chongqing (CN); Zikang Yang, Chongqing (CN)

(73) Assignee: CHONGQING UNIVERSITY, Chongqing (CN)

( * ) Notice: Subject to any disclaimer, the term of this patent is extended or adjusted under 35 U.S.C. 154(b) by 0 days.

(21) Appl. No.: 18/262,743

(22) PCT Filed: Oct. 10, 2022

(86) PCT No.: PCT/CN2022/124236
§ 371 (c)(1),
(2) Date: Jul. 25, 2023

(87) PCT Pub. No.: WO2024/027015
PCT Pub. Date: Feb. 8, 2024

(65) Prior Publication Data
US 2024/0125826 A1 Apr. 18, 2024

(30) Foreign Application Priority Data
Aug. 2, 2022 (CN) .......................... 202210923066.2

(51) Int. Cl.
*G01R 19/25* (2006.01)
*G01R 15/20* (2006.01)

(52) U.S. Cl.
CPC ....... *G01R 19/2513* (2013.01); *G01R 15/205* (2013.01)

(58) Field of Classification Search
CPC .. G01R 19/2513; G01R 15/205; G01R 27/18; G01R 33/098; G01V 3/083; G01V 2003/085; G01V 2003/086
See application file for complete search history.

(56) References Cited

U.S. PATENT DOCUMENTS

2023/0223784 A1* 7/2023 Cronin ................... B60L 58/27
320/167

FOREIGN PATENT DOCUMENTS

CN 103135137 A 6/2013
CN 103915774 A * 7/2014
(Continued)

OTHER PUBLICATIONS

Electronics Tutorials, "Kirchhoffs Circuit Law", Feb. 5, 2019, https://web.archive.org/web/20190205190012/https://www.electronics-tutorials.ws/dccircuits/dcp_4.html (Year: 2019).*
(Continued)

*Primary Examiner* — Yossef Korang-Beheshti
(74) *Attorney, Agent, or Firm* — Adam K Sacharoff; Much Shelist, PC

(57) ABSTRACT

A method for detecting a topological structure of a grounding grid under extremely cold condition, includes the following steps: in a substation in an extremely cold area, determining a measuring area S on a ground surface of a grounding grid according to the positions of branches and nodes of the grounding grid in a selected area, acquiring dynamic current values of the branches and nodes through a current sensor based on TMR tunnel magnetoresistance, and then indirectly acquiring the magnetic induction intensity of the measuring area S through conversion; calculating moduli
(Continued)

of first to third derivatives of magnetic induction intensities; and determining specific positions and laying depths of the branches of the grounding grid according to peak distances between main lobe peaks and side peaks between strong peaks of the moduli. According to the method, the calculation amount is greatly reduced, and the detection method has strong anti-interference.

9 Claims, 4 Drawing Sheets

(56)                    References Cited

FOREIGN PATENT DOCUMENTS

| CN | 104006736 | A | * | 8/2014 | |
| CN | 1004007308 | A | | 8/2014 | |
| CN | 109444510 | A | | 3/2019 | |
| CN | 109581542 | A | * | 4/2019 | ............... G01B 7/26 |
| CN | 110031668 | A | * | 7/2019 | ............. G01R 33/12 |
| CN | 110426659 | A | * | 11/2019 | ........... G01R 33/098 |
| CN | 213090796 | U | * | 4/2021 | |
| CN | 113341195 | A | * | 9/2021 | ............ G01R 15/20 |
| CN | 216084573 | U | * | 3/2022 | |
| JP | 2004045119 | A | | 2/2004 | |

OTHER PUBLICATIONS

"Allaboutcircuits, Kirchhoff's Voltage Law", Jun. 10, 2019 , https://web.archive.org/web/20190610012640/https://www.allaboutcircuits.com/textbook/direct-current/chpt-6/kirchhoffs-voltage-law-kvl/ (Year: 2019).*
Texas Instruments "TMS570LS0x32 16- and 32-Bit RISC Flash Microcontroller datasheet (Rev. C)", May 2018, https://www.ti.com/lit/gpn/tms570ls0432 (Year: 2018).*
Alt023-10E, "ALT-Series TMR Analog Magnetometer Sensors", Model ALT023-10E specifications finalized in Dec. 2021; https://www.nve.com/Downloads/ALTxxx-10.pdf (Year: 2021).*
Crocus Technology, "Non-Intrusive current-sensing using TMR: A Comparison between TMR Sensors, Sense Resistors, Hall-effect sensors, and Current Transformers", 2019, https://www.mouser.com/pdfDocs/AN118-Non-intrusive-Current-Sensing-Using-CT100-TMR-Linear-Sensor-Rev00.pdf (Year: 2019).*
Baidu, "Extremely Cold", 2025, https://baike.baidu.com/item/%e6%9e%81%e5%af%92/1635650 (Year: 2025).*
International Search Report, PCT/CN2022/124236, Jan. 4, 2023.

* cited by examiner

METHOD FOR DETECTING A TOPOLOGICAL STRUCTURE OF A GROUNDING GRID UNDER EXTREMELY COLD CONDITION

CROSS REFERENCE TO RELATED APPLICATION

This patent application is a national stage of International Application No. PCT/CN2022/124236, filed on Oct. 10, 2022, which claims the benefit of and priority to Chinese Patent Application No. 2022109230662 filed in China National Intellectual Property Administration on Aug. 2, 2022 and entitled as "METHOD FOR DETECTING A TOPOLOGICAL STRUCTURE OF A GROUNDING GRID UNDER EXTREMELY COLD CONDITION". Both of the aforementioned applications are incorporated by reference herein in their entireties as part of the present application.

TECHNICAL FIELD

The present disclosure relates to a method for reproducing a topological structure of a grounding grid under special extreme cold condition, in particular to a method for measuring a stable current of a current sensor based on TMR tunnel magnetoresistance, so as to realize a high-precision method for detecting a laying position and depth of the grounding grid.

BACKGROUND

Power is the lifeblood for rapid development of national economy. A grounding system is an indispensable part of power engineering, the only way for lightning and short-circuit fault current to enter the ground, and the cornerstone to ensure personal safety and reliable operation of equipment. With the development of extra-high voltage and smart grid, the capacity of power grid has increased rapidly, the requirements for safe operation of the grounding grid have become more and more strict, and the performance requirements for grounding materials have become higher and higher. Grounding engineering is a hidden facility buried underground, and its invisible characteristics make it difficult to locate and eliminate grounding fault points in time and accurately, and often require large-scale excavation and search, which is inefficient and inaccurate. However, when the drawings are lost, the construction is not standardized, or there are differences between the transformed topological structure and the drawings, the difficulty of troubleshooting the defects of the grounding grid will be further aggravated.

The grounding grid is an important guarantee for safe operation of a substation, and its grounding performance has always been valued by design and production and operation departments. In the safe operation of the substation, the grounding grid not only provides a common potential reference ground for all types of electrical equipment in the substation, but also can quickly discharge the fault current when the grounding grid is struck by lightning or the power system is short-circuited, and reduce the potential rise of the substation to the ground. The grounding performance of the grounding grid is directly related to the personal safety of workers in the substation and the safe and normal operation of various electrical equipment. In China, the grounding grid is generally made of flat steel, which are interconnected into a grid shape. The grounding grid is buried underground horizontally at the depth of about 0.3 to 2 meters. The grid interval is usually 3 to 7 meters. The ratio of grids on both sides is usually 1:1 to 1:3. Because the grounding grid is prone to corrosion in long-term operation, it is necessary to detect the defects of the grounding grid in time and take repair measures.

At present, the main methods of the grounding grid corrosion diagnosis comprise an analysis method based on circuit theory and an analysis method based on electromagnetic field theory. For the analysis method based on circuit theory, the grounding grid is regarded as a pure resistance network, a corrosion diagnosis equation of the grounding grid is established through specific measuring means and calculation methods by using the basic principles of circuit theory, and an actual resistance value or resistance value change rate of each branch conductor is obtained by solving the diagnosis equation, so as to judge the corrosion status of the grounding grid. This method requires knowing all or part of design drawings of the grounding grid in advance. The analysis method based on electromagnetic field mainly injects current with a certain frequency into the grounding grid, measures the surface magnetic field intensity of the grounding grid, and finally diagnoses the corrosion degree of the grounding grid according to the distribution of the magnetic field. Some scholars use the method of solving the inverse problem of the magnetic field to determine the topological structure of the grounding grid, but ill-conditioned solutions will appear in the process of solving the inverse problem of the magnetic field. The solving process is complicated.

Since document management was poor and on-site construction was in lack of standardization in the past, the design drawings of substations that have been in service for many years are missing or the buried depth and position of actual branches of the grounding grid are inconsistent with the design drawings, it is impossible to know the buried depth and position of the branches of the grounding grid, resulting in uncertain excavation depth and position of the branches of the grounding grid in actual substations. Also, in extremely cold weather, such as for substations in Inner Mongolia, since extremely low temperature will cause data loss in the current transmission process and heat dissipation will lead to increase of leakage current, it is difficult for measurement accuracy of related magnetic induction intensity to meet the requirements for reproduction of the grounding grid structure, thus bringing great technical shackles to accurate reproduction of the topological structure of the grounding grid.

CN103135137B provides a method for detecting a topological structure of a grounding grid based on a differential method, which selects a rectangular measuring area, uses an upper grounding conductor of the grounding grid in the measuring area to inject current in one point and draw current from another point, measures the magnetic induction intensity of the ground surface of the grounding grid in the direction perpendicular to the ground surface or the magnetic induction intensity in the direction parallel to the ground surface, and eliminates noise interference after digital filtering of the magnetic induction intensity. By the differential method, the modulus of a first derivative, the modulus of a third derivative and the modulus of a fifth derivative of the magnetic induction intensity in the direction perpendicular to the ground surface or the modulus of a second derivative and the modulus of a fourth derivative of the magnetic induction intensity in the direction parallel to the ground surface are obtained first. Second, the coordinate position of the main lobe peak is acquired, that is, positions of branches of the grounding grid in the measuring area. Finally, the topological structure of the grounding grid is drawn according to positions of branches of the grounding grid. The whole detection process is simple, and the amount of calculation is small. In the above disclosure, the voltage and current parameters are measured by an electromagnetic induction coil. However, in this method, the inductance and the distance from the heated body are two key parameters, in which the distance measurement is greatly affected by temperature, which cannot be widely used in extremely cold environment.

CN109061379B provides a method for identifying a topological structure of a grounding grid and a breakpoint based on induced voltage differentiation method, aiming at identifying the topological structure of the grounding grid and the breakpoint position, and providing a new method for identifying a topological structure and a breakpoint for detecting the grounding grid using a transient electromagnetic method. The method measures the electromagnetic response of the grounding grid by using a transient electromagnetic central loop device first, carries out even-order differential processing on the measured induced voltage response of the grounding grid at the same moment along the measuring lines in x direction and y direction, respectively, draws even-order differential slice diagrams of the induced voltage in x direction and y direction to obtain the positions of the conductor in y direction and the conductor in x direction of the grounding grid, and finally, merges the even-order differential data of measuring lines in x direction and y direction, draws even-order differential composite slice diagrams of the induced voltage, and acquires a complete grid topological structure of the grounding grid. The above invention aims at providing a new method for identifying a grounding grid topological structure and a breakpoint. It uses a transient electromagnetic method to measure the voltage parameters. In the process of indirectly measuring the magnetic induction intensity, there are disadvantages that the measuring process is complicated, and multiple manual judgment operations is required, and it is difficult to achieve rapid measurement of the magnetic induction intensity under extremely cold condition. However, the present disclosure applies a TMR tunnel magnetoresistance sensor to provide a method for detecting a topological structure of a grounding grid which can be applied to extremely cold condition, and has the advantages of low power consumption, short flow, intelligence, small size, high sensitivity, fast response time and the like.

SUMMARY

The present disclosure aims at solving the problems in the prior art, and provides a method for detecting a topological structure of a grounding grid under extremely cold condition. The technical scheme of the present disclosure is as follows.

The present disclosure provides a method for detecting a topological structure of a grounding grid under extremely cold condition, comprising the following steps 1-3.

Step 1 includes in a substation in an extremely cold area, determining a measuring area S on a ground surface of a grounding grid according to positions of branches and nodes of the grounding grid in a selected area, acquiring dynamic current values of the branches and nodes through a current sensor based on TMR tunnel magnetoresistance, and indirectly acquiring, through conversion, a magnetic induction intensity of the measuring area S, including the magnetic induction intensity $B_z(x, y)$ in a direction perpendicular to the ground surface and a magnetic induction intensity $B_y(x, y)$ in a direction parallel to the ground surface.

Step 2 includes calculating modulus $$\left| B_z^{(1)}(x, y) \right|$$

of a first derivative and modulus $$\left| B_z^{(3)}(x, y) \right|$$

of a third derivative of a magnetic induction intensity $B_z(x, y)$ in the direction perpendicular to the ground surface and a modulus $$\left| B_y^{(2)}(x, y) \right|$$

of a second derivative of the magnetic induction intensity $B_y(x, y)$ in the direction parallel to the ground surface by a software processing terminal.

Step 3 includes determining specific positions and laying depths of the branches of the grounding grid in the measuring area S according to peak distances between main lobe peaks and side peaks between strong peaks of the moduli of all-order derivatives in Step 2.

Further, Step 1 specifically includes the following substeps A-C.

A includes selecting any of upper grounding conductors to inject a current, and leading out the current from another upper grounding conductor except the upper grounding conductor into which the current is injected, which process utilizes upper grounding conductors of the grounding grid B includes determining a rectangular measuring area S on the ground surface of the grounding grid according to the position of selected branches of the grounding grid, wherein the measuring area S is located between the two upper grounding conductors injected with the current and leading out the current in Step A; arranging a current sensor based on TMR tunnel magnetoresistance in this area, calibrating a measuring distance between a TMR chip and a current conductor and a position in a sensitive direction of the chip accurately before a device is installed, obtaining a numerical conversion relationship between a magnitude of the magnetic field at the TMR chip and the current in the current conductor, obtaining a relationship among the output voltage of the TMR chip, the power supply voltage of the TMR chip, and magnitude of the magnetic field in the sensitive direction of the TMR chip according to an output characteristics of the chip; determining a power supply voltage of the chip by the above calculation and analysis, and obtaining a relationship between the output voltage of the chip and the magnitude of the current in the measured conductor; taking an upward direction perpendicular to the measuring area S as a positive direction of z axis, wherein the selected grounding grid branches is on x axis, the current direction of the selected grounding grid branches is the same as a positive direction of the x axis, taking a midpoint of the selected grounding grid branches as a coordinate origin, and establishing a right-handed cartesian coordinate system xyz, wherein x axis and y axis which are the coordinate axes are parallel or perpendicular to sides of the measuring area S;

C includes dividing the measuring area S into M×N grids, wherein boundaries of the grids are parallel or perpendicular to x axis, selecting a node $P_{ij}$ of the grid as a measuring point, a position coordinate corresponding to the measuring point being $(x_{ij}, y_{ij})$, and measuring the magnetic induction intensity $B_z(x, y)$ perpendicular to the ground surface and the magnetic induction intensity $B_y(x, y)$ along a positive direction of y axis at the measuring point $P_{ij}$, wherein M is a number of rows of the grids, and N is a number of columns of the grids, in which $1 \leq i \leq M+1$, and $1 \leq j \leq N+1$.

Further, the following step in Step B, the obtaining a numerical conversion relationship between a magnitude of a magnetic field at the TMR chip and a current in the current conductor, obtaining a relationship among an output voltage of the TMR chip, a power supply voltage of the TMR chip, and a magnitude of the magnetic field in a sensitive direction of the TMR chip according to output characteristics of the chip; determining the power supply voltage of the chip by above calculation and analysis, and obtaining a relationship between the output voltage of the chip and the magnitude of the current in the measured conductor, is expressed in following expressions.

Establishing a relationship between the magnetic field and current, in which the magnetic field generated by current-carrying conductors in space according to Biot-Savart Law can be expressed as:

$$\vec{B} = \int d\vec{B} = \int \frac{\mu_0 I}{4\pi} \frac{d\vec{l} \times \vec{r}}{r^3}$$

It is assumed that a current flows inside a long straight wire, a distance between a point P and a wire CD in space is $r_0$, included angles between connecting lines between the point P and both ends of the long straight wire and the wire are $\theta_1$ and $\theta_2$, respectively, and a magnetic field at the point P can be expressed as:

$$B = \frac{\mu_0 I}{4\pi r_0} \int_{\theta_1}^{\theta_2} \sin\theta d\theta = \frac{\mu_0 I}{4\pi r_0} (\cos\theta_1 - \cos\theta_2)$$

According to the characteristics of the TMR sensor, the output voltage of the TMR sensor has a linear relationship with a magnitude of a surrounding magnetic field in a certain range of magnetic field intensity; when the current I flows inside the conductor, according to a right-hand screw rule, a spiral linear magnetic field is generated around the wire, and a magnitude of the magnetic field is proportional to a magnitude of the current inside the conductor Since an output voltage of a bridge structure inside the TMR sensor has a linear relationship with a resistance of a tunnel magnetoresistance element, a change of resistance of the tunnel magnetoresistance element caused by a change of an external magnetic field caused by a change of the current of the conductor linearly affects the output voltage of the TMR bridge structure, so that a TMR tunnel magnetoresistance sensor is capable of measuring a current of a corresponding conductor.

Further, the current sensor based on TMR tunnel magnetoresistance includes a TMR chip measuring module, a data processing unit, a display unit, a temperature detecting unit, a control unit, a heating unit and a device housing. The TMR chip measuring module generates a voltage output signal under action of the current magnetic field of the conductor and transmits the signal to a data processing unit inside the device through a signal transmission line. The data processing unit processes data according to a current measuring method based on TMR tunnel magnetoresistance, and writes a corresponding microcontroller program algorithm by combining with a voltage signal gain of a signal amplification module in the data processing unit, and performs denoising process by using an FFT algorithm in the program algorithm to obtain an accurate current value of the measured conductor, so as to obtain the current value of the current conductor and display the current value on the display unit. The control unit consists of an integrated microcontroller, can work normally in the extremely cold temperature range by selecting a military-grade master control chip with strong low-temperature resistance, and is capable of being directly cold started, so that a main program of a core unit of the current sensor based on TMR tunnel magnetoresistance is capable of being started normally under extremely cold condition. In the measurement process, the temperature detection unit detects the internal temperature of the device and transmits a detection result to the control unit, which starts the heating unit if the acquired temperature value is less than a preset temperature threshold, and turns off the heating unit if temperature value acquired by the temperature detection unit is greater than a preset upper temperature threshold, thus repeatedly heating to ensure that the internal temperature of the device is within a suitable range.

Further, the TMR chip measuring module includes a TMR chip and a mechanical support structure, the TMR chip measuring module is fixed at a designated position, and the included angle between the mechanical support structure and the axis of the current conductor is arbitrary; the TMR chip uses a line sensitive direction or a surface sensitive direction; the TMR chip is a highly sensitive tunnel magnetoresistance element. TMR chip can convert a magnetic signal into an electrical signal based on the magnetoresistance effect. For magnets with different magnetic field intensities in a moving part and for different detection distances, accurate positioning of magnets can be realized. The included angle between the sensitive direction of the TMR chip and the direction perpendicular to the axis of the current conductor is arbitrary. The sensitive direction of the TMR chip may be perpendicular to the direction of environmental noise magnetic field, or may have an arbitrary angle with the direction of environmental noise magnetic field.

Further, the data processing unit processes data according to a current measuring method based on TMR tunnel magnetoresistance, and then combines with the voltage signal gain of a signal amplification module in the data processing unit to write a corresponding microcontroller program algorithm, and uses an FFT algorithm to denoise in the program algorithm to obtain the accurate current value of the measured conductor, specifically comprising the following steps.

The current measuring method based on TMR tunnel magnetoresistance comprises: (1) measuring an output voltage of the TMR sensor, (2) filtering the collected signal, (3) calculating a magnitude of the magnetic induction intensity according to the magnitude of the output voltage, (4) calculating a magnitude of the current based on on-site dimensions and material parameters with Biot-Savart Law, and writing a corresponding microcontroller program algorithm based on the voltage signal gain of the signal amplification module in the data processing unit, and using the FFT algorithm to denoise in the program algorithm, specifically comprising the following steps.

Those steps includes: (1) reading a magnitude of the voltage output by the TMR sensor with an ADC; (2) performing FFT transformation on a collected discrete signal sequence in time domain; (3) processing frequency spectrums resulted from the transformation, and performing zero setting on unnecessary signals to eliminate noises of a specific frequency component; (4) performing IFFT transformation on signals of the processed frequency spectrum to obtain filtered signals.

Further, the TMR chip is a chip made of TMR tunnel magnetoresistance material, which is used to accurately measure the size of the magnetic field and generate a voltage output signal in extremely cold environment;

A low-temperature resistant military-level master control chip is selected as the microcontroller, which is capable of working normally in the extremely cold temperature range and being directly cold started.

Further, an inner layer of a device housing of the current sensor of the TMR tunnel magnetoresistance is an insulation layer made of insulation materials, multiple groups of protrusions are arranged between the inner insulation layer and the outer electromagnetic shielding layer to prevent the two layers from contacting and transferring heat, and air between the inner insulation layer and the outer electromagnetic shielding layer is evacuated to form a vacuum cavity; the heating unit is in heat conduction connection with a heat conduction layer covered on the inner surface of the device housing, so that the heat conduction layer conducts the heat generated by the heating unit to all parts in the device; and the display unit uses a cold-proof liquid crystal display or a digital tube.

Further, the current injected by the upper grounding conductor in Step A is a stable sinusoidal signal with a frequency of 20 to 2000 Hz and an amplitude of 0 to 10 A.

The M×N grids have an equal interval $\Delta x$ in x axis direction and an equal interval $\Delta y$ in y axis direction.

Further, the side peak of the strong peak of the moduli of all-order derivatives in Step 3 refers to a first side peak next to the main peak; the peak distance between the main peak and the side peak refers to the distance between the peak value of the main peak and the peak value of the side peak in the direction parallel to the y axis.

The buried depth and position of the branches of the grounding grid in the measuring area S in Step 3 are 0.577 times of the peak distance between the main peak and the side peak of the modulus $$\left|B_z^{(1)}(x, y)\right|$$

of a first derivative of the magnetic induction intensity $B_z(x, y)$ in the direction perpendicular to the ground surface, 1.376 times of the peak distance between the main peak and the side peak of the modulus $$\left|B_z^{(3)}(x, y)\right|$$

of a third derivative, and/or 1 time of the peak distance between the main peak and the side peak of the modulus $$\left|B_y^{(2)}(x, y)\right|$$

of a second derivative of the magnetic induction intensity $B_y(x, y)$ in the direction parallel to the ground surface.

According to the specific embodiments provided by the present disclosure, the present disclosure provides the following technical effects.

In the present disclosure, a rectangular measuring area S is selected according to positions of selected branches of the grounding grid, an upper grounding conductor of the grounding grid is adopted to inject, through the current sensor based on TMR tunnel magnetoresistance, current at one point and lead out current from another point. During measurement, the sensor is fixed in the designated measuring area. The magnetic field around the conductor is measured by the TMR chip module, and the voltage signal is output to the data processing unit. The data processing unit processes the obtained current value of the target conductor and displays the current value on the display unit, thus effectively achieving accurate current measurement in extremely cold environment. In this way, the magnetic induction intensity of the ground surface of the grounding grid in the direction perpendicular to the ground surface or the magnetic induction intensity in the direction parallel to the ground surface is measured through the electromagnetic conversion relationship between the current and the magnetic induction intensity. Noise interferences of other frequencies mainly with odd power frequency are eliminated after digital filtering of the magnetic induction intensity. The magnetic induction intensity $B_z(x, y)$ of the ground surface of the grounding grid in the direction perpendicular to the ground surface or the magnetic induction intensity $B_y(x, y)$ in the direction parallel to the ground surface is measured. Noise interference is eliminated after digital filtering of the magnetic induction intensity $B_z(x, y)$ or $B_y(x, y)$. Through differential derivation, the modulus $$\left|B_z^{(1)}(x, y)\right|$$

of a first derivative and the modulus $$\left|B_z^{(3)} - (x, y)\right|$$

of a third derivative of the magnetic induction intensity $B_z(x, y)$ or the modulus $$\left|B_y^{(2)}(x, y)\right|$$

of a second derivative of the magnetic induction intensity $B_y(x, y)$ are first obtained. The peak distances between the main peaks and the side peaks of the moduli of all-order derivatives are then obtained, so as to determine the buried depths and the laying positions of the branches of the grounding grid in the measuring area S. The buried depth of the branches of the grounding grid in the measuring area S is 0.577 times of the peak distance between the main peak and the side peak of the modulus $$\left|B_z^{(1)}(x, y)\right|$$

of a first derivative of the magnetic induction intensity $B_z(x, y)$ in the direction perpendicular to the ground surface, 1.376 times of the peak distance between the main peak and the side peak of the modulus $$\left| B_z^{(3)}(x, y) \right|$$

of a third derivative, and/or 1 time of the peak distance between the main peak and the side peak of the modulus $$\left| B_y^{(2)}(x, y) \right|$$

of a second derivative of the magnetic induction intensity $B_y(x, y)$ in the direction parallel to the ground surface. It is easy to operate in the whole detection process, the indirect calculation amount is greatly reduced, and the detection method has strong anti-interference.

The present disclosure provides the following advantages: (1) a highly integrated measuring device is adopted, that is, the TMR tunnel magnetoresistance current sensor, which realizes no data loss under extremely cold condition, simple operation, and a reduced indirect calculation amount.

(2) ADC integrated filtering is used, and an excitation power supply above 1 kHZ is applied, which greatly reduces the interference from odd power frequency signals.

(3) Zero setting is fully realized to spurious signals by FFT transform, which greatly reduces the subsequent calculation amount.

(4) The overall operation steps are simple, and efficient data transmission is realized by the military level chip of the TMR sensor.

BRIEF DESCRIPTION OF THE DRAWINGS

In order to explain the embodiments of the present disclosure or the technical scheme in the prior art more clearly, the drawings recited in the embodiments will be briefly introduced hereinafter. Apparently, the drawings in the following description show only some embodiments of the present disclosure. For those skilled in the art, other drawings can be obtained according to these drawings without paying creative labor.

DETAILED DESCRIPTION OF THE EMBODIMENTS

The technical scheme in the embodiments of the present disclosure will be described clearly and completely hereinafter with reference to the drawings in the embodiments of the present disclosure. Apparently, the described embodiments are only some embodiments of the present disclosure, rather than all of the embodiments. Based on the embodiments of the present disclosure, all other embodiments obtained by those skilled in the art without paying creative labor belong to the scope of protection of the present disclosure.

The technical scheme of the present disclosure for solving the technical problems is as follows.

Figure 1:
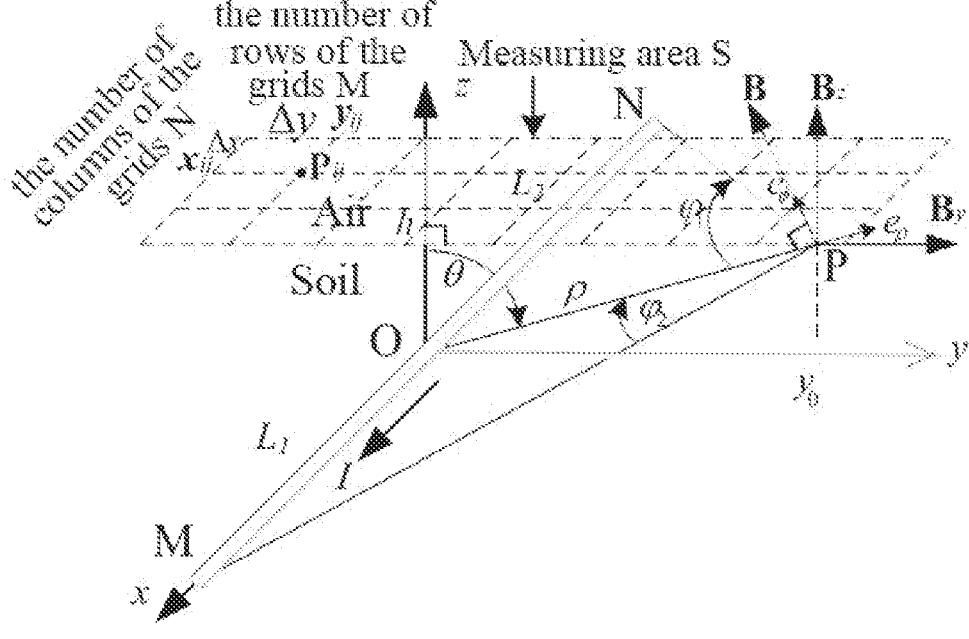
FIG. 1 is a schematic diagram for marking measuring points according to a preferred embodiment of the present disclosure.

Referring to FIG. 1, in actual situations, the length of branches of the grounding grid of the substation is fixed. In the xyz coordinate system, a current-carrying conductor MN with a length of L is horizontally buried in single-layer uniform soil with permeability $\mu$. The conductor is placed in parallel with and on x axis. The length OM of the current-carrying conductor on the positive semi-axis of x axis is $L_1$, and the length ON on the negative semi-axis of x axis is $L_2$. The ground surface is parallel to the xoy plane and the distance therebetween is h. The current flowing through the conductor is I, and the direction of the current is along the positive direction of the x axis. The vertical distance from a point P which is located on the ground surface and in yoz plane to the current-carrying conductor is $\rho$. The included angle between the line segment OP and the positive direction of the z axis is $\theta$, the included angle between the line segment OP and the line segment NP is $\varphi_1$, and the included angle between the line segment OP and the line segment MP is $\varphi_2$. It is assumed that below the plane z=h is a single-layer uniform soil with permeability $\mu$, and the permeability of the soil is approximately the permeability $\mu_o$ in vacuum. The leakage current of the conductor on the soil is ignored.

The following values are assigned: I=1 A, h=1 m, $L_1=L_2=3$ m.

As shown in FIG. 1, a measuring surface S with an area of 12 m×12 m is selected on the ground surface of the grounding grid. The measuring surface S is divided into 599×599 grids. The edges of the grids are parallel or perpendicular to x axis. The grids have an equal interval $\Delta x=2$ cm in x axis direction. The grids have an equal interval $\Delta y=2$ cm in y axis direction. A node $P_{ij}$ of the grid is a measuring point. The measuring point has a corresponding position coordinate $(x_{ij}, y_{ij})$. A magnetic induction intensity $B_z(x, y)$ perpendicular to the ground surface at the measuring point P is measured. A magnetic induction intensity $B_y(x, y)$ parallel to a positive direction of y axis at the measuring point $P_{ij}$ is measured, wherein M is the number of rows of the grids, and N is the number of columns of the grids, in which $1 \leq i \leq 600$, and $1 \leq j \leq 600$.

Figure 2:
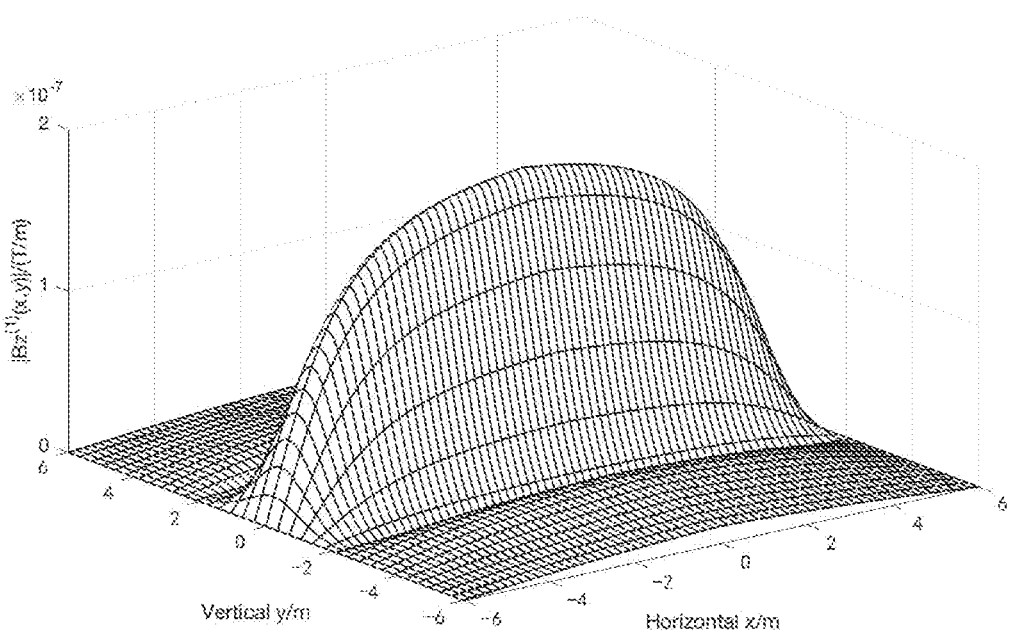
FIG. 2 is a distribution diagram of $$\left| B_z^{(1)}(x, y) \right|;$$

A modulus $$|B_z^{(1)}(x, y)|$$

of a first derivative of the magnetic induction intensity $B_z(x, y)$ is acquired, as shown in FIG. 2.

Taking a position variable x of the measuring point as an independent variable, the first derivative $$\frac{\partial B_z(x, y)}{\partial x}$$

of the magnetic induction intensity $B_z(x, y)$ is acquired.

Taking a position variable v of the measuring point as an independent variable, the first derivative $$\frac{\partial B_z(x, y)}{\partial y}$$

of the magnetic induction intensity $B_z(x, y)$ is acquired.

The modulus $$|B_z^{(1)}(x, y)| = \sqrt{\left(\frac{\partial B_z(x, y)}{\partial x}\right)^2 + \left(\frac{\partial B_z(x, y)}{\partial y}\right)^2}$$

of the first derivative of the magnetic induction intensity $B_z(x, y)$ is acquired.

According to the method of the present disclosure, during measurement, after Step 1 and before the calculation in Step 2, the magnetic induction intensity $B_z(x, y)$ in a direction perpendicular to the ground surface and/or the magnetic induction intensity $B_y(x, y)$ in a direction parallel to the ground surface can be digitally filtered first.

The specific steps of acquiring the moduli of all-order derivatives in Step 2 are as follows.

The process of acquiring the modulus $$|B_z^{(3)}(x, y)|$$

of a third derivative of the magnetic induction intensity $B_z(x, y)$ is as follows.

Taking the position variable x of the measuring point as an independent variable, the first derivative $$\frac{\partial B_z(x, y)}{\partial x}$$

of the magnetic induction intensity $B_z(x, y)$ is acquired.

Taking the position variable y of the measuring point as an independent variable, the first derivative $$\frac{\partial B_z(x, y)}{\partial y}$$

of the magnetic induction intensity $B_z(x, y)$ is acquired.

Taking the position variable x of the measuring point as an independent variable, a second derivative $$\frac{\partial^2 B_z(x, y)}{\partial x^2}$$

of the magnetic induction intensity $B_z(x, y)$ is acquired.

Taking the position variable y of the measuring point as an independent variable, a second derivative $$\frac{\partial^2 B_z(x, y)}{\partial y^2}$$

of the magnetic induction intensity $B_z(x, y)$ is acquired.

Taking the position variable x of the measuring point as an independent variable, a third derivative $$\frac{\partial^3 B_z(x, y)}{\partial x^3}$$

of the magnetic induction intensity $B_z(x, y)$ is acquired.

Taking the position variable y of the measuring point as the independent variable, a third derivative $$\frac{\partial^3 B_z(x, y)}{\partial y^3}$$

of the magnetic induction intensity $B_z(x, y)$ is acquired.

The modulus $$|B_z^{(3)}(x, y)| = \sqrt{\left(\frac{\partial^3 B_z(x, y)}{\partial x^3}\right)^2 + \left(\frac{\partial^3 B_z(x, y)}{\partial y^3}\right)^2}$$

of the third derivative of the magnetic induction intensity $B_z(x, y)$ is acquired.

The process of acquiring the modulus $$|B_z^{(1)}(x, y)|$$

of the first derivative of the magnetic induction intensity $B_z(x, y)$ is as follows.

Taking the position variable x of the measuring point as an independent variable, the first derivative $$\frac{\partial B_z(x, y)}{\partial x}$$

of the magnetic induction intensity $B_z(x, y)$ is acquired.

Figures 3, 4:
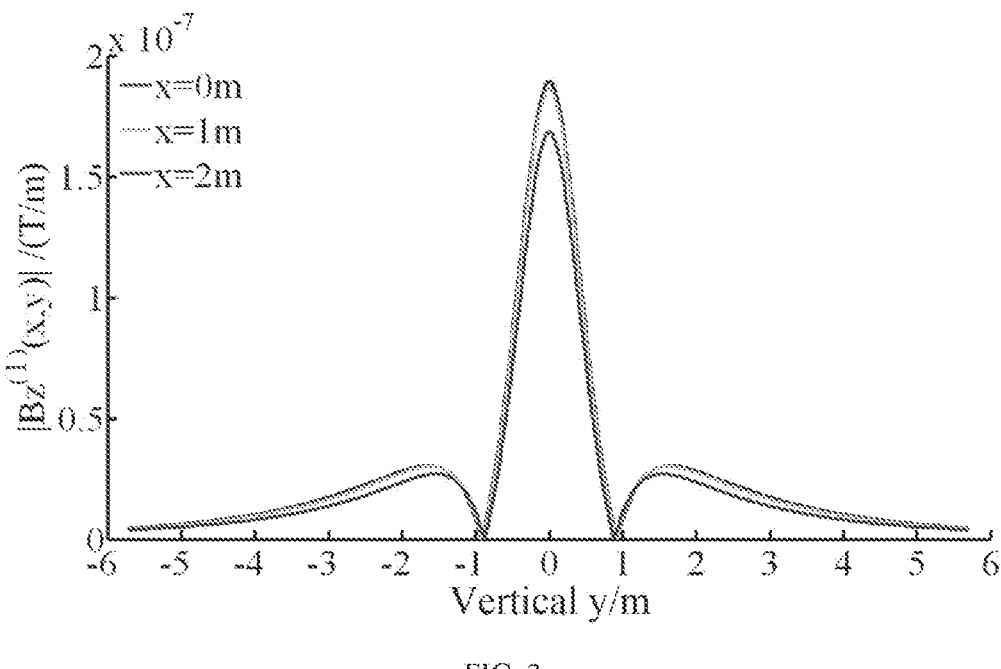
FIG. 3 is a sectional view of $$\left| B_z^{(1)}(x, y) \right|;$$
FIG. 4 is a distribution diagram of $$\left| B_z^{(3)}(x, y) \right|;$$
Figure 5:
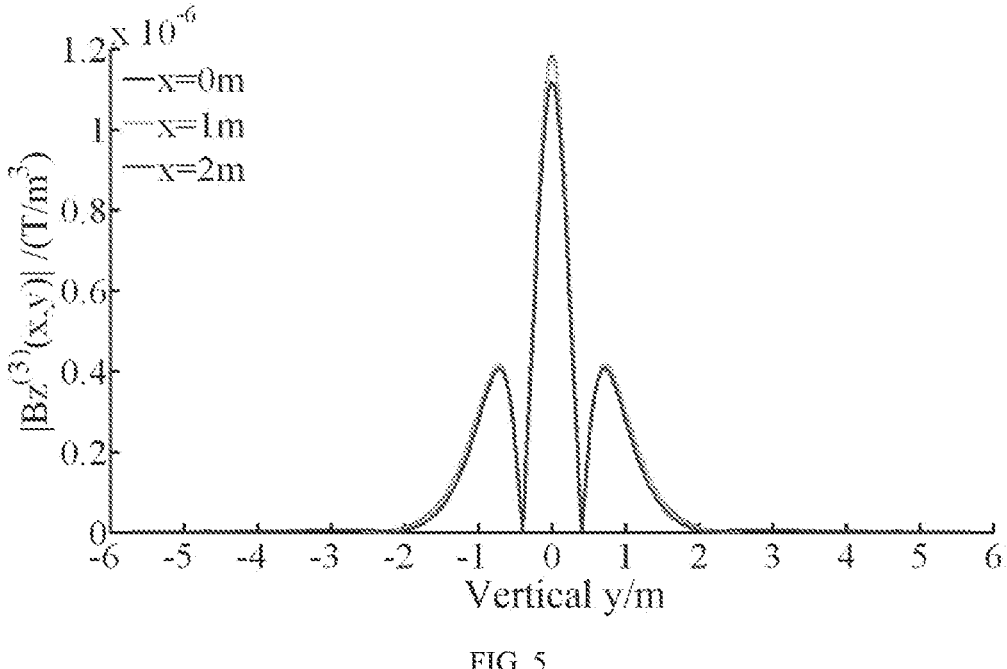
FIG. 5 is a sectional view of $$\left| B_z^{(3)}(x, y) \right|;$$

Taking the position variable y of the measuring point as an independent variable, the first derivative $$\frac{\partial B_z(x,\, y)}{\partial y}$$

of the magnetic induction intensity $B_z$(x, y) is acquired.
  The modulus $$\left|B_z^{(1)}(x,\, y)\right| = \sqrt{\left(\frac{\partial B_z(x,\, y)}{\partial x}\right)^2 + \left(\frac{\partial B_z(x,\, y)}{\partial y}\right)^2}$$

of the first derivative of the magnetic induction intensity $B_z$(x, y) is acquired.
  The process of acquiring the modulus $$\left|B_y^{(2)}(x,\, y)\right|$$

of a second derivative of the magnetic induction intensity $B_y$(x, y) is as follows.
  Taking the position variable x of the measuring point as an independent variable, a first derivative $$\frac{\partial B_y(x,\, y)}{\partial x}$$

of the magnetic induction intensity $B_y$(x, y) is acquired.
  Taking the position variable y of the measuring point as an independent variable, a first derivative $$\frac{\partial B_y(x,\, y)}{\partial y}$$

of the magnetic induction intensity $B_y$(x, y) is acquired.
  Taking the position variable x of the measuring point as an independent variable, a second derivative $$\frac{\partial^2 B_y(x,\, y)}{\partial x^2}$$

of the magnetic induction intensity $B_y$(x, y) is acquired.
  Taking the position variable y of the measuring point as the independent variable, a second derivative $$\frac{\partial^2 B_y(x,\, y)}{\partial y^2}$$

of the magnetic induction intensity $B_y$(x, y) is acquired.
  The modulus $$\left|B_y^{(2)}(x,\, y)\right| = \sqrt{\left(\frac{\partial^2 B_y(x,\, y)}{\partial x^2}\right)^2 + \left(\frac{\partial^2 B_y(x,\, y)}{\partial y^2}\right)^2}$$

of the second derivative of the magnetic induction intensity $B_y$(x, y) is acquired.
  Referring to FIG. 3, a cross section of x=0 m in FIG. 2 is acquired. A coordinate position of the peak value of the main peak of $$\left|B_z^{(1)}(x,\, y)\right|$$

acquired from the cross section of x=0 m is y=0 m, and a coordinate position of the peak value of the side peak of $$\left|B_z^{(1)}(x,\, y)\right|$$

is y=±1.73 m. The buried depth of the branches of the grounding grid can be determined as h=0.577×1.73 m=0.998821 m.
  The modulus $$\left|B_z^{(3)}(x,\, y)\right|$$

of the third derivative of the magnetic induction intensity $B_z$(x, y) is acquired, as shown in FIG. 4.
  Taking the position variable x of the measuring point as an independent variable, the third derivative $$\frac{\partial^3 B_z(x,\, y)}{\partial x^3}$$

of the magnetic induction intensity $B_z$(x, y) is acquired.
  Taking the position variable y of the measuring point as an independent variable, the third derivative $$\frac{\partial^3 B_z(x,\, y)}{\partial y^3}$$

of the magnetic induction intensity $B_z$(x, y) is acquired.
  The modulus $$\left|B_z^{(3)}(x,\, y)\right| = \sqrt{\left(\frac{\partial^3 B_z(x,\, y)}{\partial x^3}\right)^2 + \left(\frac{\partial^3 B_z(x,\, y)}{\partial y^3}\right)^2}$$

of the third derivative of the magnetic induction intensity $B_z$(x, y) is acquired.
  Referring to FIG. 5, a cross section of x=0 m in FIG. 4 is acquired. A coordinate position of the peak value of the main peak of $$\left|B_z^{(3)}(x,\, y)\right|$$

acquired from the cross section of x=0 m is y=0 m, and a coordinate position of the peak value of the side peak of $$\left|B_z^{(3)}(x,\, y)\right|$$

is y=±0.7265 m. The buried depth of the branches of the grounding grid can be determined as h=1.376×0.7265 m=0.99966 m.

Figure 6:
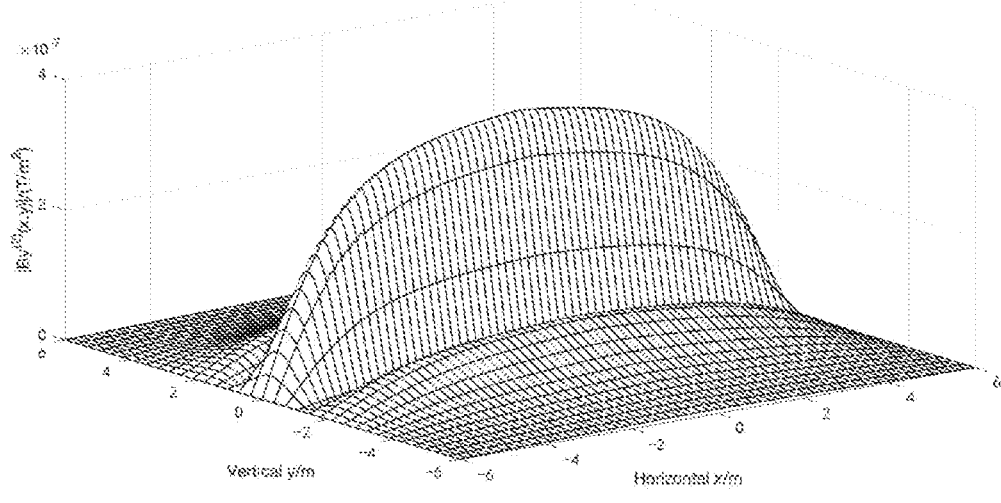
FIG. 6 is a distribution diagram of $$\left| B_y^{(2)}(x, y) \right|;$$

The modulus $$\left|B_y^{(2)}(x,\,y)\right|$$

of the second derivative of the magnetic induction intensity $B_y(x, y)$ is acquired, as shown in FIG. 6.

Taking the position variable x of the measuring point as an independent variable, the second derivative $$\frac{\partial^2 B_y(x,\,y)}{\partial x^2}$$

of the magnetic induction intensity $B_y(x, y)$ is acquired.

Taking the position variable y of the measuring point as an independent variable, the second derivative $$\frac{\partial^2 B_y(x,\,y)}{\partial y^2}$$

of the magnetic induction intensity $B_y(x, y)$ is acquired.

The modulus $$\left|B_y^{(2)}(x,\,y)\right| = \sqrt{\left(\frac{\partial^2 B_y(x,\,y)}{\partial x^2}\right)^2 + \left(\frac{\partial^2 B_y(x,\,y)}{\partial y^2}\right)^2}$$

of the second derivative of the magnetic induction intensity $B_y(x, y)$ is acquired.

Figure 7:
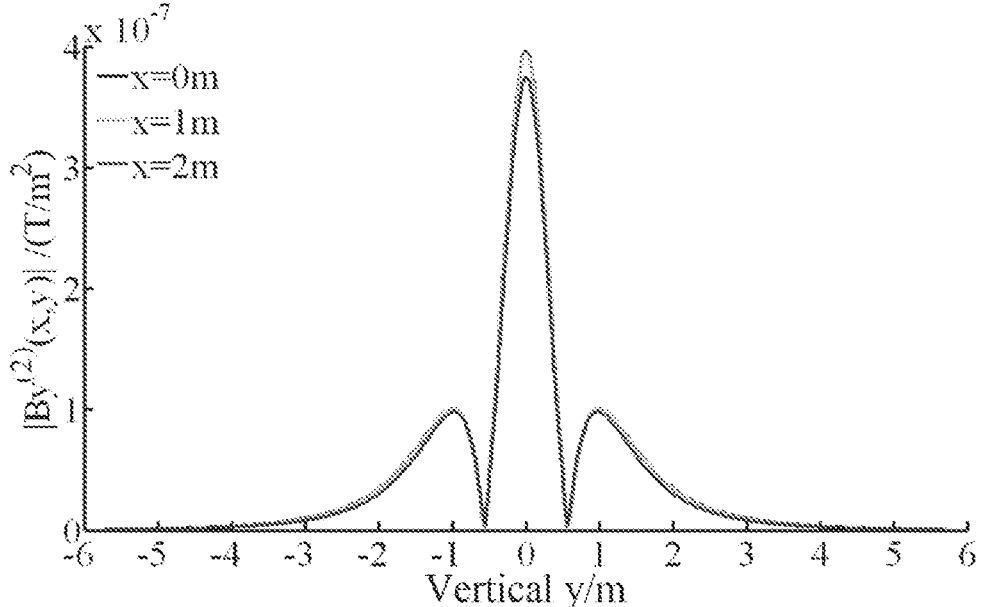
FIG. 7 is a sectional view of $$\left| B_y^{(2)}(x, y) \right|.$$

Referring to FIG. 7, a cross section of x=0 m in FIG. 6 is acquired. A coordinate position of the peak value of the main peak of $$\left|B_y^{(2)}(x,\,y)\right|$$

acquired from the cross section of x=0 m is y=0 m, and a coordinate position of the peak value of the side peak of $$\left|B_y^{(2)}(x,\,y)\right|$$

is y=±1 m. The buried depth of the branches of the grounding grid can be determined as h=1×1 m=1 m.

The system, device, module or unit set forth in the above embodiments can be specifically realized by computer chips or entities or by products with certain functions. A typical implementing device is a computer. Specifically, the computer can be, for example, a personal computer, a laptop computer, a cellular phone, a camera phone, a smart phone, a personal digital assistant, a media player, a navigation device, an email device, a game console, a tablet computer, a wearable device or a combination of any of these devices.

It should also be noted that the terms "comprise", "include" or any other variation thereof are intended to cover non-exclusive inclusion, so that the process, method, commodity or device including a series of elements includes not only those elements, but also other elements not explicitly listed, or elements inherent to such process, method, commodity or device. Without more restrictions, an element defined by the phrase "including one" does not exclude the presence of other identical elements in the process, method, commodity or device including the elements.

The above embodiments should be understood as only illustrating the present disclosure, rather than limiting the protection scope of the present disclosure. Upon reading contents recited in the present disclosure, those skilled in the art can make various changes or modifications to the present disclosure, and these equivalent changes and modifications also fall within the scope defined by the claims of the present disclosure.

What is claimed is:

1. A method capable of detecting a topological structure of a grounding grid in extremely cold conditions below minus 40 degrees Celsius, comprising following steps:

Step 1, which comprises in a substation in an extremely cold area, determining a measuring area(S) on a ground surface of a grounding grid according to positions of branches and nodes of the grounding grid in a selected area, acquiring dynamic current values of the branches and the nodes through a current sensor based on tunnel magnetoresistance (TMR), and indirectly acquiring, through conversion, a magnetic induction intensity of the measuring area(S), which comprises a magnetic induction intensity $B_z(x, y)$ in a direction perpendicular to the ground surface and a magnetic induction intensity $B_y(x, y)$ in a direction parallel to the ground surface;

Step 2, calculating a modulus $$\left|B_z^{(1)}(x,\,y)\right|$$

of a first derivative and a modulus $$\left|B_z^{(3)}(x,\,y)\right|$$

of a third derivative of the magnetic induction intensity $B_z$ (x, y) in the direction perpendicular to the ground surface and a modulus $$\left|B_y^{(2)}(x,\,y)\right|$$

of a second derivative of the magnetic induction intensity $B_y(x, y)$ in the direction parallel to the ground surface by a software processing terminal; and Step 3, determining specific positions and laying depths of the branches of the grounding grid in the measuring area(S) according to peak distances between main lobe peaks and side peaks between strong peaks of the moduli of all-order derivatives in Step 2;

wherein the current sensor based on TMR tunnel magnetoresistance comprises a TMR chip measuring module, a data processing unit, a display unit, a temperature detecting unit, a control unit, a heating unit and a device housing, wherein the TMR chip measuring module generates a voltage output signal under an action of the magnetic field of the current conductor and transmits the voltage output signal to the data processing unit inside the device through a signal transmission line; the data processing unit processes data according to a current measuring method based on TMR tunnel magnetoresistance, and writing a corresponding microcontroller tram algorithm by using a voltage signal gain of a signal amplification module in the data processing unit, and performing denoising process by using an Fast Fourier Transform (FFT) algorithm in the program algorithm to obtain an accurate current value of the current conductor, and display the accurate current value on the display unit; the control unit consists of an integrated microcontroller, and is capable of working in an extremely cold temperature range below minus 40 degrees Celsius by selecting a military-level master control chip with strong low-temperature resistance, and is capable of being directly cold started, so that a main program of a core unit of the current sensor based on TMR tunnel magnetoresistance is capable of being started under the extremely cold conditions; during measurement, the temperature detection unit detects an internal temperature of the device and transmits a detection result to the control unit, which starts the heating unit if a value of the acquired temperature is less than a preset temperature threshold, and thereafter turns off the heating unit if the value of the temperature acquired by the temperature detection unit is greater than a preset upper temperature threshold, thus repeatedly heating to ensure that the internal temperature of the device is within a suitable range;

wherein, the data processing ta according to a current measuring method based on TMR tunnel magnetoresistance, and writing a corresponding microcontroller program algorithm by using a voltage signal of a signal amplification module in the data processing unit, and performing denoising process by using an FFT algorithm in the program algorithm to obtain an accurate current value of the current conductor, comprises:

the current measuring method based on TMR tunnel magnetoresistance, comprising: (1) measuring the output voltage of the TMR sensor, (2) filtering collected signals, (3) calculating a magnitude of retic induction Intensity according magnitude of the output voltage, (4) calculating of the current as of Biot-Savart Law based on-site size and material parameters, and writing corresponding microcontroller program algorithm based on the voltage signal gain of the signal amplification module in the data processing unit, and performing a denoising process by using the FFT algorithm in the program algorithm, specifically comprising: (1) reading a magnitude of the voltage output by the TMR sensor with an Analog-to-Digital Converter (ADC); (2) performing FFT transformation on a collected discrete signal sequence in time domain; (3) processing frequency spectrums resulted from the transformation, and performing zero setting on unnecessary signals to eliminate noises of a specific frequency component: (4) performing Inverse Fast Fourier Transform (IFFT) transformation on signals of the processed frequency spectrum to obtain filtered signals.

2. The method according to claim 1, wherein Step 1 comprises:

A, selecting any of upper grounding conductors to inject a current, and leading out the current from another upper grounding conductor except the upper grounding conductor into which the current is injected, which process utilizes upper grounding conductors of the grounding grid;

B, determining a rectangular measuring area(S) on the ground surface of the grounding grid according to the positions of the branches of the selected grounding grid, wherein the measuring area(S) is located between the two upper grounding conductors respectively injected with the current and leading out the current in Step A; arranging the current sensor based on TMR tunnel magnetoresistance in the measuring area, calibrating a measuring distance between a TMR chip and a current conductor and a position in a sensitive direction of the chip accurately before a device is installed, obtaining a numerical conversion relationship between a magnitude of a magnetic field at the TMR chip and a current in the current conductor, obtaining a relationship among an output voltage of the TMR chip, a power supply voltage of the TMR chip, and a magnitude of a magnetic field in a sensitive direction of the TMR chip according to output characteristics of the chip, determining the power supply voltage of the chip by above calculation and analysis, and obtaining a relationship between the output voltage of the chip and a magnitude of the current in the current conductor; establishing a right-hand cartesian coordinate system xyz with a midpoint of the branches of the selected grounding grid as an coordinate origin, and an upward direction perpendicular to the measuring area(S) as a positive direction of z axis, wherein the branches of the selected grounding grid is on x axis, a current direction of the branches of the selected grounding grid is the same as a positive direction of x axis, x axis and y axis are parallel or perpendicular to sides of the measuring area S;

C, dividing the measuring area(S) into M×N grids, wherein boundaries of the grids are parallel or perpendicular to x axis, selecting a node $P_{ij}$ of the grids as a measuring point, a position coordinate corresponding to the measuring point being $(x_{ij}, y_{ij})$, and measuring the magnetic induction intensity $B_z(x, y)$ perpendicular to the ground surface and the magnetic induction intensity $B_y(x, y)$ along a positive direction of y axis at the measuring point $P_{ij}$, wherein M is a number of rows of the grids, and N is a number of columns of the grids, in which $1 \leq i \leq M+1$, and $1 \leq j \leq N+1$.

3. The method according to claim 2, wherein in Step B, the obtaining a numerical conversion relationship between a magnitude of a magnetic field at the TMR chip and a current in the current conductor, obtaining a relationship among an output voltage of the TMR chip, a power supply voltage of the TMR chip, and a magnitude of the magnetic field in a sensitive direction of the TMR chip according to output characteristics of the chips, determining the power supply voltage of the chip by above calculation and analysis, and obtaining a relationship between the output voltage of the chip and a magnitude of the current in the current conductor, comprise:

(1) establishing a relationship between the magnetic field and the current, in which the magnetic field generated by current-carrying conductors in space according to Biot-Savart Law is expressed as:

$$\vec{B} = \int d\vec{B} = \int \frac{\mu_0 I}{4\pi} \frac{d\vec{l} \times \vec{r}}{r^3}$$

(2) assuming that a current flows inside a long straight wire, a distance between a point P and a wire CD in space is $r_0$, included angles between connecting lines between the point P and both ends of the long straight wire and the wire are $\theta_1$ and $\theta_2$, respectively, and a magnetic field at the point P is expressed as:

$$B = \frac{\mu_0 I}{4\pi r_0} \int_{\theta_1}^{\theta_2} \sin\theta d\theta = \frac{\mu_0 I}{4\pi r_0}(\cos\theta_1 - \cos\theta_2)$$

wherein, according to characteristics of the TMR sensor, an output voltage of the TMR sensor has a linear relationship with a magnitude of a surrounding magnetic field in a certain range of magnetic field intensity; when a current/flows inside the current conductor, according to a right-hand screw rule, a spiral linear magnetic field is generated around the wire, and a magnitude of the magnetic field is proportional to a magnitude of the current inside the current conductor;

(3) wherein since an output voltage of a bridge structure inside the TMR sensor has a linear relationship with a resistance of a tunnel magnetoresistance element, a change of resistance of the tunnel magnetoresistance element caused by a change of an external magnetic field caused by a change of the current of the current conductor linearly affects the output voltage of the bridge structure, so that the TMR tunnel magnetoresistance sensor is capable of measuring the current of the current conductor.

4. The method according to claim 1, wherein the TMR chip measuring module comprises a TMR chip and a mechanical support structure, the TMR chip measuring module is fixed at a designated position, and an included angle between the mechanical support structure and an axis of the current conductor is arbitrary; the TMR chip uses a line sensitive direction or a surface sensitive direction; the TMR chip is a tunnel magnetoresistance element, which is capable of converting a magnetic signal into an electrical signal based on magnetoresistance effect and positioning magnets with different magnetic field intensities and located in a moving p rt at differ detection distances from the TMR chip; an included angle between a sensitive direction of the TMR chip and a direction perpendicular to the axis of current conductor is arbitrary; the sensitive direction of the TMR chip is perpendicular to a direction of environmental noise magnetic field, or has an arbitrary angle with the direction of environmental noise magnetic field.

5. The method according to claim 4, wherein the TMR chip is a chip made of TMR tunnel magnetoresistance material, which is used to accurately measure a magnitude of a magnetic field and generate a voltage output signal in extremely cold environment; for the microcontroller is selected a low-temperature resistant military-level master control chip, which is capable of working in an extremely cold temperature range and being directly cold started.

6. The method according to claim 1, wherein an inner layer of the device housing of the current sensor of the TMR tunnel magnetoresistance is an insulation layer made of insulation materials, a plurality of groups of protrusions are arranged between the inner insulation layer and an outer electromagnetic shielding layer that prevents the two layers from contacting and transferring heat, and air between the inner insulation layer and the outer electromagnetic shielding layer is evacuated to form a vacuum cavity; the heating unit is in heat conduction connection with a heat conduction layer covered on an inner surface of the device housing, so that the heat conduction layer conducts heat generated by the heating unit to all parts in the device; and for the display unit is adopted a cold-proof liquid crystal display or a digital tube.

7. The method according to claim 2, wherein the current injected with the upper grounding conductor in Step A is a stable sinusoidal signal with a frequency of 20 to 2000 Hz and an amplitude of 0 to 10 A;

the M×N grids have an equal interval $\Delta x$ in x axis direction and an equal interval $\Delta y$ in y axis direction.

8. The method according to claim 1, wherein the side peaks of the strong peaks of the moduli of all-order derivatives in Step 3 refer to first side peaks next to main peaks; the peak distances between the main peaks and the side peaks refer to distances between peak values of the main peaks and peak values of the side peaks in a direction parallel to y axis;

the buried depths and positions of the branches of the grounding grid in the measuring area(S) in Step 3 are 0.577 times of the peak distance between the main peak and the side peak of the modulus $$\left|B_z^{(1)}(x, y)\right|$$

of the first derivative of the magnetic induction intensity $B_z$ (x, y) in the direction perpendicular to the ground surface, 1.376 times of the peak distance between the main peak and the side peak of the modulus $$\left|B_z^{(3)}(x, y)\right|$$

of the third derivative, and/or 1 time of the peak distance between the main peak and the side peak of the modulus $$\left|B_y^{(2)}(x, y)\right|$$

of the second derivative of the magnetic induction intensity $B_y(x, y)$ in the direction parallel to the ground surface.

9. A method for detecting a topological structure of a grounding grid, comprising:

Step 1, in a substation, determining a measuring area(S) on a ground surface of a grounding grid according to positions of branches and nodes of the grounding grid in a selected area, acquiring dynamic current values of the branches and the nodes through a current sensor based on tunnel magnetoresistance (TMR), and indirectly acquiring, through conversion, a magnetic induction intensity of the measuring area(S), which comprises a magnetic induction intensity $B_z$ (x, y) in a direction perpendicular to the ground surface and a magnetic induction intensity $B_y(x, y)$ in a direction parallel to the ground surface;

Step 2, calculating a modulus $$\left|B_z^{(1)}(x, y)\right|$$

of a first derivative and a modulus $$\left|B_z^{(3)}(x, y)\right|$$

of a third derivative of the magnetic induction intensity $B_z(x, y)$ in the direction perpendicular to the ground surface and a modulus $$\left| B_y^{(2)}(x, y) \right|$$

of a second derivative of the magnetic induction intensity $B_y(x, y)$ in the direction parallel to the ground surface by a software processing terminal; and Step 3, determining specific positions and laying depths of the branches of the grounding grid in the measuring area(S) according to peak distances between main lobe peaks and side peaks between strong peaks of the moduli of all-order derivatives in Step 2;

wherein the current sensor based on TMR tunnel magnetoresistance comprises a TMR chip measuring module, a data processing unit, a display unit, a temperature detecting unit, a control unit, a heating unit and a device housing, wherein the TMR chip measuring module generates a voltage output signal under an action of the magnetic field of the current conductor and transmits the voltage output signal to the data processing unit inside the device through a signal transmission line; the data processing unit processes data according to a current measuring method based on TMR tunnel magnetoresistance, and writing a corresponding microcontroller program algorithm by using a voltage signal gain of a signal amplification module in the data processing unit, and performing denoising process by using an Fast Fourier Transform (FFT) algorithm in the program algorithm to obtain an accurate current value of the current conductor, and display the accurate current value on the display unit; the control unit consists of an integrated microcontroller; during measurement, the temperature detection unit detects an internal temperature of the device and transmits a detection result to the control unit, which starts the heating unit if a value of the acquired temperature is less than a preset temperature threshold, and thereafter turns off the heating unit if the value of the temperature acquired by the temperature detection unit is greater than a preset upper temperature threshold, thus repeatedly heating to ensure that the internal temperature of the device is within a suitable range;

wherein the data processing unit processes data according to a current measuring method based on TMR tunnel magnetoresistance, and writing a corresponding microcontroller program algorithm by using a voltage signal gain of a signal amplification module in the data processing unit, and performing denoising process by using an FFT algorithm in the program algorithm to obtain an accurate current value of the current conductor, comprises:

the current measuring method based on TMR tunnel magnetoresistance, comprising: (1) measuring the output voltage of the TMR sensor, (2) filtering collected signals, (3) calculating a magnitude of a magnetic induction intensity according to a magnitude of the output voltage, (4) calculating a magnitude of the current by means of Biot-Savart Law based on an on-site size and material parameters, and writing corresponding microcontroller program algorithm based on the voltage signal gain of the signal amplification module in the data processing unit, and performing a denoising process by using the FFT algorithm in the program algorithm, specifically comprising:

(1) reading a magnitude of the voltage output by the TMR sensor with an Analog-to-Digital Converter (ADC); (2) performing FFT transformation on a collected discrete signal sequence in time domain; (3) processing frequency spectrums resulted from the transformation, and performing zero setting on unnecessary signals to eliminate noises of a specific frequency component; (4) performing Inverse Fast Fourier Transform (IFFT) transformation on signals of the processed frequency spectrum to obtain filtered signals.

* * * * *